United States Patent [19]

Beauchesne

[11] Patent Number: 5,601,122
[45] Date of Patent: Feb. 11, 1997

[54] DUAL MODE SINGLE DEVICE DUAL ACTION LEAD FORMING TOOL

[75] Inventor: Robert C. Beauchesne, Brockton, Mass.

[73] Assignee: Bull HN Information Systems Inc., Billerica, Mass.

[21] Appl. No.: 508,199

[22] Filed: Jul. 27, 1995

[51] Int. Cl.⁶ .................................................. B21F 45/00
[52] U.S. Cl. ............................... 140/106; 140/123; 7/107
[58] Field of Search .................... 7/107, 108; 72/409.01; 140/102.5, 104, 105, 106, 121, 123; 29/741

[56] References Cited

U.S. PATENT DOCUMENTS 1,624,534  4/1927  Chewning ..................... 72/409.01
2,955,624  10/1960  Ferm ............................... 140/123
3,626,995  12/1971  Keenan, Jr. ..................... 140/106

*Primary Examiner*—Lowell A. Larson
*Attorney, Agent, or Firm*—Faith F. Driscoll; John S. Solakian

[57]  ABSTRACT

A single device dual action lead forming tool uses standard long nose pliers as the basis of its construction. A set of lead forming elements is incorporated into each plier jaw element. Each set contains forming tooth and forming receptacle elements positioned adjacent to one another in a predetermined manner. The elements of one set are arranged within one jaw element in a reverse order relative to the arrangement of lead forming elements in the other jaw element. When the jaw elements are closed, pairs of like positioned forming tooth and receptacle elements of both sets cooperate together to form both the inner and other leads of a single electronic component in a single operation.

14 Claims, 5 Drawing Sheets

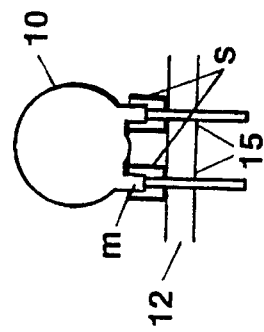
Figure 1a
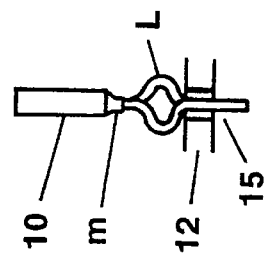
Figure 1b
Figure 1c
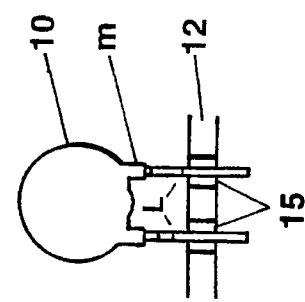
Figure 1d-1
Figure 1d-2
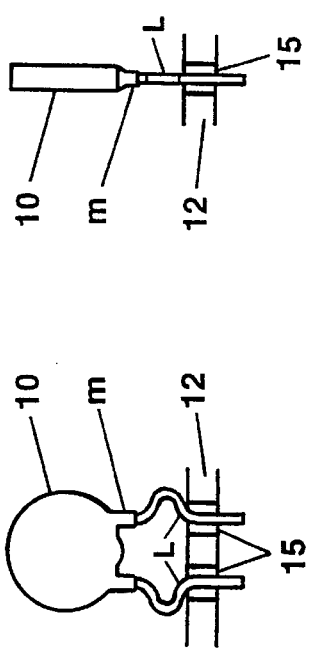
Figure 1e-1
Figure 1e-2

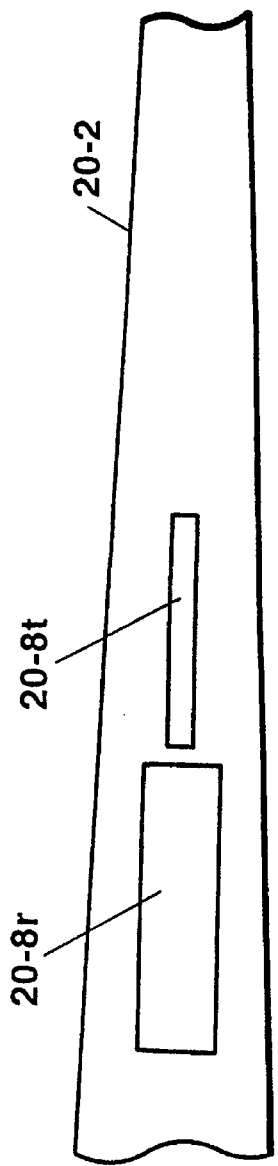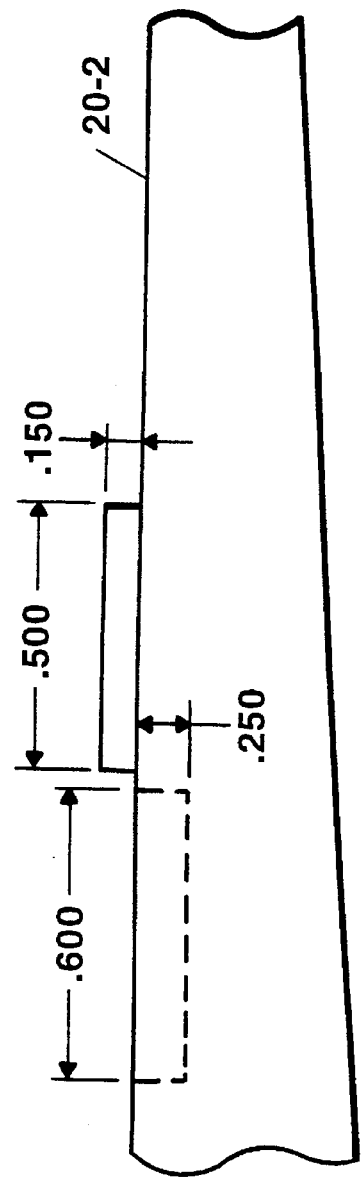

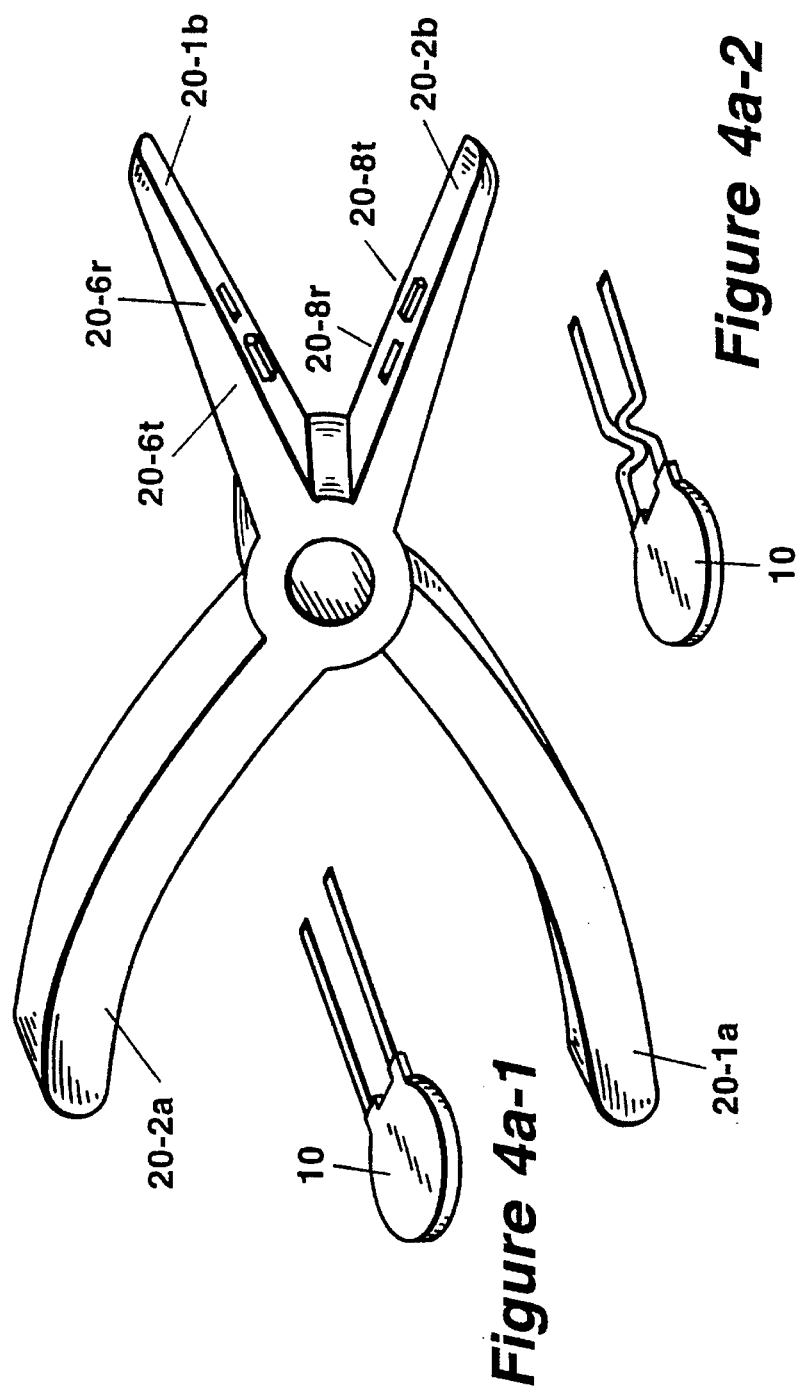

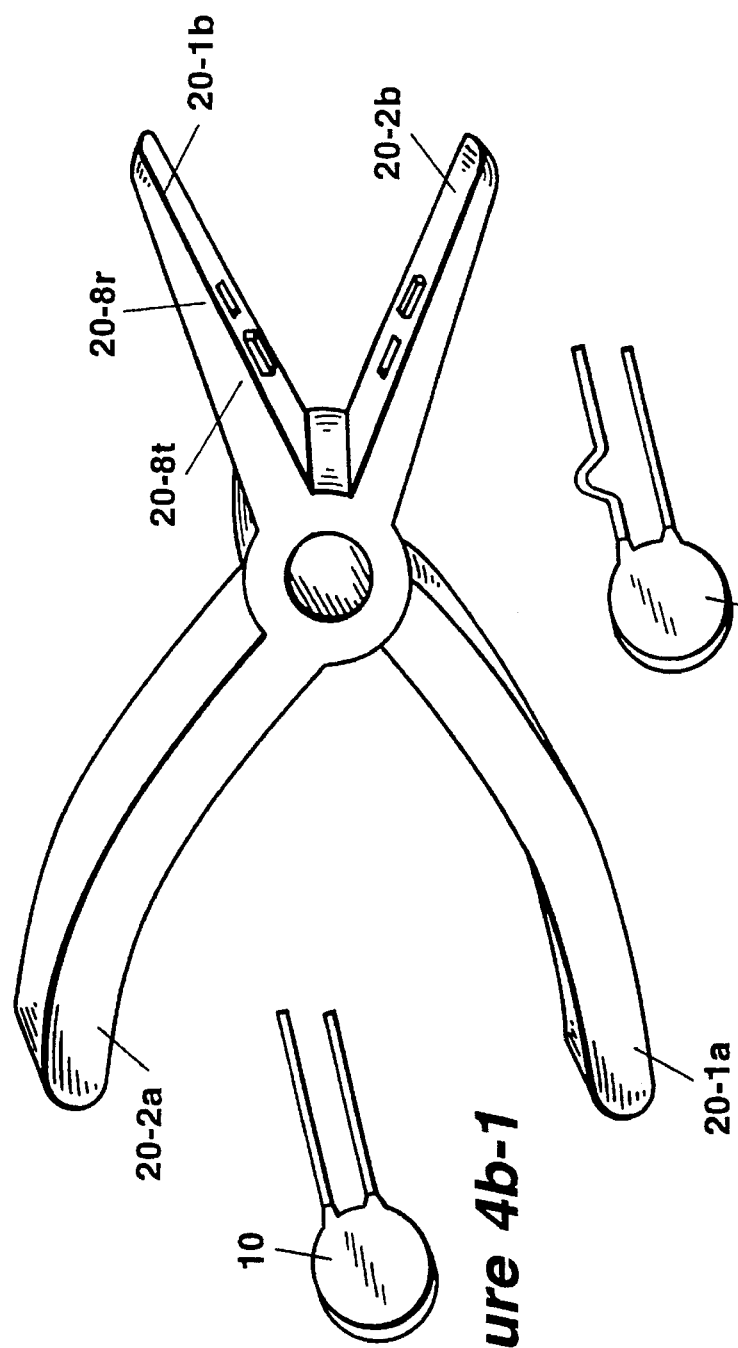

DUAL MODE SINGLE DEVICE DUAL ACTION LEAD FORMING TOOL

BACKGROUND OF THE INVENTION

1. Field of Use

The present invention relates to hand tools and methods for forming component leads and more particularly, to a tool and method for forming the leads of electrode components mounted on a printed circuit board.

2. Prior Art

When ceramic component devices are manufactured such as a ceramic disk capacitors, LEDs etc., such devices have a certain amount of component material deposited around their leads, called meniscus. Each such component is required to be vertically mounted in plated through holes of a printed circuit board and then soldered in place during the board fabrication. It is important that the meniscus be prevented from entering the circuit board hole area in order to insure good solderability of the component.

To insure good solderability of such components, one technique employed is to apply sleeving on the device's pair of leads to form a barrier to keep the meniscus out of the hole. This operation is very costly to perform. For example, it has been determined that the amount of time required to put sleeves on the pair of leads of a single component is the same amount of time as that required to put the component on the board.

Another technique which could be employed involves the use of automatic lead forming equipment to perform a lead forming operation on the component leads. Such equipment requires that the components be contained on a component tape mounted on a reel wherein the placement of components on the tape allows the automatic tool to hold the component in place while the forming tool is in operation. To implement this operation is necessary to add a preform and cut operation prior to the assembly operation of the board fabrication process. This can prove both time consuming and costly in terms of having to purchase component parts in that form which may not be justified in cases of low volume manufacture. Further, since not every board of a product may be identical, it may not be possible to perform the required lead forming operation on all product boards in the same manner.

Accordingly, it is a primary object of the present invention to provide a tool and method for forming the pair of leads of a component which is vertically mounted on a printed circuit board.

It is a more specific object of the present invention to provide a tool and method of performing a forming operation on vertically mounted printed circuit board components within a minimum time and expense.

SUMMARY OF THE INVENTION

The above objects of the present invention are achieved in a preferred embodiment of a single device dual action lead forming tool which uses standard long nose pliers as the basis of its construction. First and second sets of lead forming elements are incorporated into the inner flat portions of both jaw elements of the pliers. Each set contains forming tooth and forming receptacle elements positioned adjacent to one another in a predetermined manner. The elements of one set are arranged in reverse order relative to the arrangement of forming elements in the other jaw element. When the jaw elements are closed, the pairs of like positioned forming tooth and receptacle elements of both sets cooperate to form the inner and outer leads of a single component into the desired configuration in a single operation.

More specifically, the sets of lead forming elements are designed so that the inner forming tooth of one set fits into the inner receptacle element of the other set while the outer forming receptacle of the one set fits into the outer forming tooth element of the other set. Thus, when the leads of a component are placed across the flat portion of one of the pair of jaw elements and the plier jaw elements are closed, this causes the pairs of like positioned forming tooth and forming receptacle elements to form the pair of component leads within the receptacle elements into the appropriate configurations. That is, the inner and outer tooth elements exert forces in opposite directions on equivalent portions of both component leads shaping them into the appropriate configurations within the receptacle elements. The configurations establish a barrier which prevent the meniscus from entering the plated through holes upon component insertion. In the preferred embodiment, the lead configurations correspond to complementary loops which provide the required barrier between the meniscus and the portions of the component leads to be mounted on the printed circuit board. The forming of both component leads takes place in a single operation which markedly increases efficiency.

While the forming tool is most efficiently used in forming both leads of a component, the tool can also be used in separately forming each lead of a component. This would be done when the dimensions of the component exceed the dimensions of the sets of forming elements. Thus, the tool of the present invention can be operated in two different modes, a dual action mode in which both the leads of the component are formed into a desired configuration during a single operation and in a single action mode when each lead of the component is formed into the desired configuration in two successive operations.

In the preferred embodiment of the present invention, long nose pliers are used as part of the tool's the basic construction. The long nose plier construction was selected since it is the type of tool that manufacturing personnel most frequently carry on their person. The sets of lead forming elements of the present invention are incorporated into the tool jaw elements in a manner which preserves the normal symmetry, balance and functionality so that the tool can be used in performing its normal functions as well as being used to carry out the lead forming method of the present invention.

The above objects and advantages of the present invention will be better understood from the following description when taken in conjunction with the accompanying drawings.

BRIEF DESCRIPTION OF THE DRAWINGS

FIGS. 1a through 1e2 illustrate different component configurations used in describing the lead forming operation of the present invention.

FIG. 2 is a perspective view of a lead forming tool constructed according to the teachings of the present invention.

FIGS. 3a and 3b are enlarged top and side views respectively showing a portion of one of the jaw elements of the tool of FIG. 1 which incorporates the teachings of the present invention.

FIGS. 4a and 4b are used to illustrate the different modes of operation of the lead forming tool of the present invention.

DESCRIPTION OF THE PREFERRED EMBODIMENT

Figure 2:
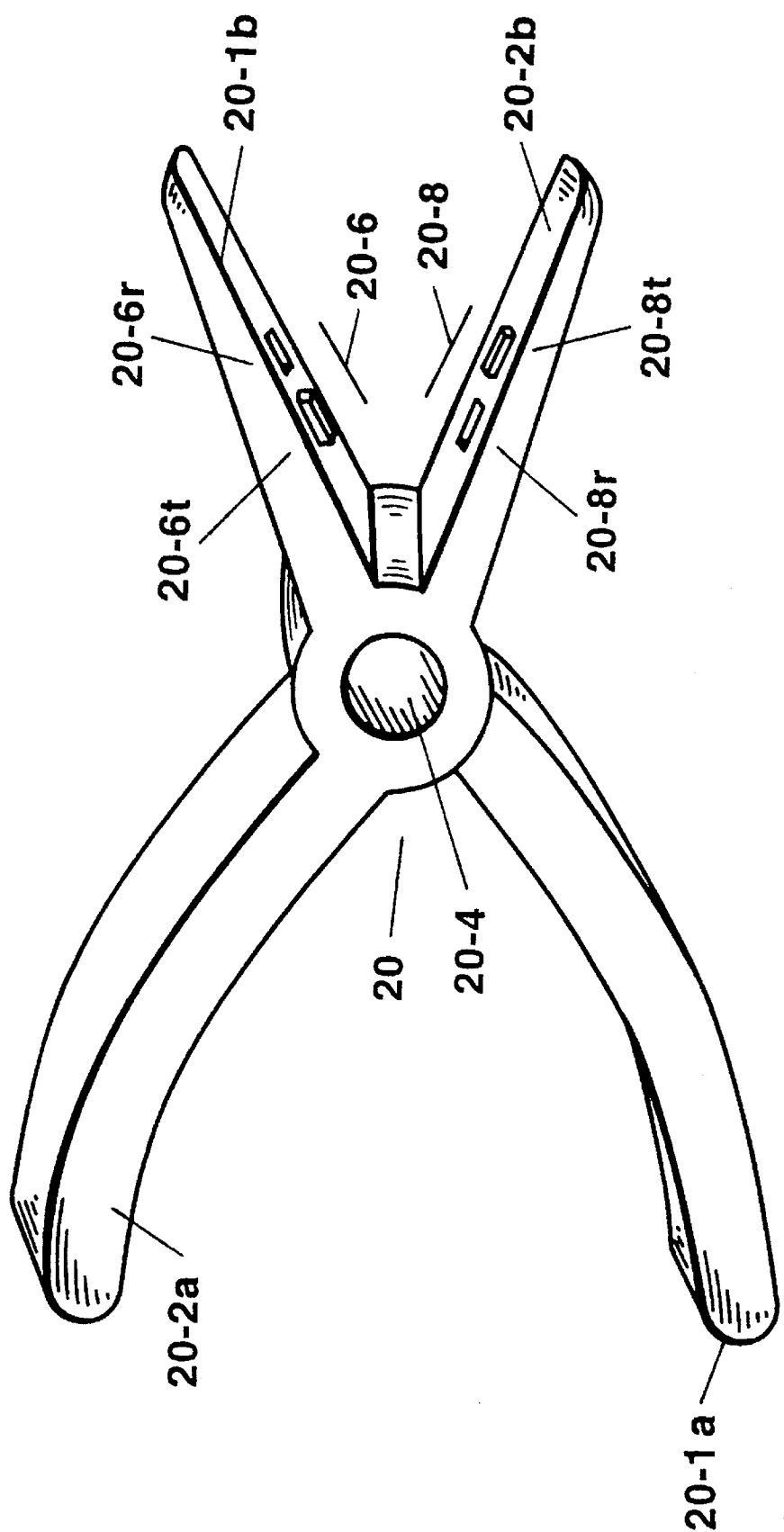

Before describing the lead forming tool of the present invention, it is useful to briefly review certain aspects of the overall problem which the tool solves. FIG. 1a illustrates a typical component 10 which is the type of component requiring a lead barrier when mounted in a printed circuit board. More specifically, the component 10 is a radial ceramic disk capacitor which when manufactured has some form of meniscus "m" formed on its leads as shown in FIG. 1a.

As part of the board fabrication process, this type of component is required to be vertically mounted on a printed circuit board 12 through a pair of plated through holes 15 as illustrated in FIG. 1b. When so mounted, it is seen from FIG. 1b that some of the meniscus enters the plated through holes. When this component is soldered into place, the meniscus has been found to adversely affect the quality of the soldered connection (solderability) of the component to the board. To overcome this problem, it has been the practice to apply sleeving S to the leads of the component to form a barrier which prevents the meniscus from affecting the solderability of the component. This technique is illustrated in FIG. 1c.

An alternative to the sleeving method is to use lead forming as a method for providing an appropriate barrier. The lead forming tool of the present invention operates to provide the required barrier in an efficient and inexpensive manner. The views of FIGS. 1d1 and 1d2 illustrate the results of using the tool of the present invention in a single action mode of operation wherein the leads of component 10 are formed over two successive operations. The views of FIGS. 1e1 and 1e2 illustrate the results of using the tool of the present invention in a dual action mode of operation wherein the leads of component 10 are formed in a single operation. In both cases, the symmetrical pair of loops "L" form the required barrier which prevents meniscus from entering the circuit board area which would adversely affect the solderability of the component. These modes of operation will be described in greater detail with reference to FIGS. 4a and 4b.

FIG. 2 is a perspective view of the lead forming tool 20 of the present invention. As shown, the body of the tool 20 uses a standard long nose plier construction which includes two major pieces 20-1 and 20-2. The piece 20-1 has a handle portion 20-1a and jaw element portion. The piece 20-2 also has a handle portion 20-2a and jaw element portion 20-2b. Both pieces are joined together in standard manner by a pivot pin 20-4 which passes through axially aligned holes contained in each of the pieces 20-1 and 20-2 as shown in FIG. 2.

In accordance with the teachings of the present invention, the jaw element portions of the pliers 20 are modified to incorporate first and second sets 20-6 and 20-8 of lead forming elements into the inner flat portions of the upper and lower jaw element portions 20-1b and 20-2b of pliers 20. As shown, the first set 20-6 contains forming tooth element 20-6T and forming receptacle element 20-6R positioned adjacent to one another as shown. The second set 20-8 contains forming tooth element 20-8T and forming receptacle element 20-8R which are positioned in reverse order relative to the order of lead forming elements of set 20-6 contained in jaw element portion 20-1. The elements of both sets are positioned relative to each other within the inner flat portions of jaw element portions 20-1b and 20-2b so they form symmetrical and complementary pairs of lead forming units.

FIGS. 3a and 3b are top and side views of the lower jaw element portion 20-2b which illustrates in greater detail, the construction of the set of forming elements 20-6 constructed according to the present invention. It is assumed that component leads having a standard lead size are being formed by the tool 20. For such leads, the receptacle element 20-8R is approximately 0.250 inches deep and 0.600 inches in length. The receptacle width is slightly wider than the width of the forming tooth element 20-6T. The forming tooth element 20-8T has a height of approximately. 0.150 inches and a length of approximately 0.500 inches. The width of the tooth element 20-8T is selected to be slightly wider than the width of a standard lead size so that it properly bends the lead within the receptacle 20-6K. The edges of the element 20-8T are contoured so as not to damage the lead during the formation process. Also, the edges of forming receptacle 20-8 are similarly contoured.

The set of forming elements 20-6 incorporated into upper jaw element 20-2b have the same dimensions as those of set 20-8. The elements differ only in that the positions of the forming tooth and receptacle are reversed.

DESCRIPTION OF OPERATION

As discussed above, the dual action tool 20 of the present invention can be used in either of two modes of operation. The preferred mode is the dual action dual lead mode of operation illustrated in FIG. 4a. In this mode, the leads of the ceramic disk capacitor 10 are placed across the lower jaw element portion 20-2b so that the leads are somewhat centered across both forming receptacle 20-8R and forming tooth element 20-8T. It will be noted that the capacitor 10 and the flat portion of lower jaw element portion 20-2b are both located in a horizontal plane. When the jaw element portions 20-1b and 20-2b are closed by squeezing the handle portions 20-1a and 20-2a, inner tooth element 20-6T and outer tooth element 20-8T exert forces of similar magnitude in opposite directions on the inner and outer leads of capacitor 10. That is, inner tooth element 20-6T exerts a force in a downward direction while outer tooth element 20-8T exerts a force in an upward direction. The forces applied to the leads of capacitor 10 forces them into receptacles 20-6R and 20-8R which results in bending both leads into the "loop" configurations shown in FIG. 4a. The FIGS. 1e1 and 1e2 illustrate the loop configurations of the inner and outer leads of capacitor 10 when viewed from the side and front.

FIG. 4b illustrates the dual action single lead forming mode of operation of tool 20. The lead forming operation is performed by the tool in a manner which is similar to that described in connection with FIG. 4a. The major difference is that only a single pair of elements are used since only one lead of capacitor 10 is formed at a time. The elements of the pair are outer forming tooth 20-8T and outer forming receptacle 20-6R.

As indicated in FIG. 4b, one of the leads of capacitor 10 is placed across outer forming tooth 20-8T while the other lead is positioned under and clear of the jaw element portion 20-2b. Thus, when the tool 20 is used in this mode of operation, the orientation of capacitor 10 is changed so that its leads are in a plane which is perpendicular to the flat working surface of lower jaw element portion 20-2b so that the other lead remains clear of the tool as indicated in the Figure.

When the jaw element portions 20-1b and 20-2b are closed by squeezing the handle portions 20-1a and 20-2a, the outer forming tooth element 20-8T exerts an upward force on the capacitor lead forcing it into forming receptacle 20-6R. This results in the capacitor lead being shaped into a single "loop" configuration as indicated in FIG. 4b. This operation is repeated using the other lead of capacitor 10. The end result is that the leads of capacitor 10 contain loops which conform to the configuration shown in the front and side views of FIGS. 1d1 and 1d2.

It is now seen how a tool constructed according to the teachings of the present invention is able to perform lead forming operations on both leads or on a single lead of a component. The tool is constructed to utilize as the basis of its construction, standard long nose pliers which are modified to incorporate two sets of lead forming elements within the flat working surfaces of the plier jaw element portions. The sets of forming elements are incorporated in a way that maintains the balance and symmetry of the tool so that it can be utilized to perform its normal function.

It will be apparent to those skilled in the art that many changes may be made to the preferred embodiment of the present invention. For example, the present invention is not limited to the formatting of particular type of long nose plier construction or to specific dimensions or shapes.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A tool for forming the leads of a component having menicus on portions thereof which is to be mounted vertically on a printed circuit board, said tool comprising:
    a long nose plier body having two major pieces, each piece having jaw element portion with a flat working surface and a handle portion, the pieces being pivotally connected by a pivot so that as the two handle portions are squeezed toward each other, the jaw portions come together placing the flat working surfaces in contact, each jaw element flat work surface containing:
        a set of lead forming elements consisting of a forming tooth element and a forming receptacle element positioned adjacent to each other in a predetermined order, the predetermined order of the lead forming elements of one set being opposite to the predetermined order of lead forming elements of the other set so that when the jaw element portions are closed, pairs of like positioned forming tooth and forming receptacle elements of the sets cooperate together to bend both leads of the component placed across the working surfaces of the jaw element portions into a desired configuration in a single operation for preventing any lead meniscus from coming in contact with the printed circuit board when the component is vertically mounted on the board.

2. The tool of claim 1 wherein the pair containing an outer forming tooth element and outer forming receptacle element produce a force in a predetermined direction which is opposite to the direction of the force produced by the pair containing an inner forming tooth element and inner receptacle element.

3. The tool of claim 1 wherein the forming tooth element and forming receptacle element of each pair are shaped so that the forming tooth element fits completely within the forming receptacle element thereby enabling the tool to be used to carry out long nose plier functions.

4. The tool of claim 2 wherein each forming tooth element is rectangular in shape and has a predetermined height.

5. The tool of claim 4 wherein each forming tooth element has a width which is slightly greater than a standard size lead.

6. The tool of claim 2 wherein the forming receptacle element is a rectangular shaped cavity which is slightly larger than the forming tooth element.

7. The tool of claim 1 wherein the desired configuration corresponds to a pair of loop shapes which provides a separation barrier between meniscus portions and remaining portions of the leads for preserving the solderability of the component.

8. The tool of claim 7 wherein each of loop shapes in the leads is in a plane which is perpendicular to the other.

9. The tool of claim 1 wherein the tool is operated in a second mode wherein one component lead at a time is placed over an outer forming tooth element while the other lead is positioned clear of the body of the tool and the jaw element portions are closed causing the bending of the one lead within the like positioned forming receptacle element into the desired configuration.

10. The tool of claim 9 wherein the desired configuration corresponds to a pair of loop shapes, each of which is positioned in the same or a parallel plane.

11. The tool of claim 1 wherein the component is a ceramic disk capacitor which is vertically mounted on the printed circuit board by passing the leads through plated through holes and soldering the component leads in place.

12. A single device dual action lead forming tool capable of being operated in first and second modes for forming a barrier between the portions of the leads of a component having menicus thereon and the portions of the leads which are to be mounted through plated through holes on a printed circuit board, said tool comprising:
    a long nose plier body having two sections, each section having jaw element portion with a flat working surface and a handle portion, the sections being pivotally connected by a pivot so that as the two handle portions are squeezed toward each other, the working surfaces of the jaw portions make contact, each jaw element flat work surface containing:
        a set of lead forming elements consisting of a forming tooth element and a forming receptacle element positioned adjacent to each other in a predetermined sequence, the predetermined sequence of the lead forming elements of one set being complementary to the predetermined sequence of lead forming elements of the other set so that when the jaw element portions are closed, pairs of like positioned forming tooth and forming receptacle elements of the sets mate together bending both or one of the leads of the component into a predetermined configuration when operated in the first and second modes respectively for preventing any lead meniscus from coming in contact with the printed circuit board when the component is vertically mounted on the board.

13. The tool of claim 12 wherein during the first mode of operation both pairs of like positioned lead forming elements are used to perform lead forming operations on the leads of the component in a single operation and during the second mode of operation only one pair of like positioned forming elements is used to perform a lead forming on one of the component leads at a time.

14. The tool of claim 13 wherein the one pair of like positioned forming elements consists of an outer forming tooth element and an outer forming receptacle element.

* * * * *